(12) United States Patent
Xu

(10) Patent No.: US 10,784,287 B2
(45) Date of Patent: Sep. 22, 2020

(54) TFT SUBSTRATE AND MANUFACTURING METHOD THEREOF

(71) Applicant: Shenzhen China Star Optoelectronics Semiconductor Display Technology Co., Ltd., Shenzhen (CN)

(72) Inventor: Hongyuan Xu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 228 days.

(21) Appl. No.: 15/743,918

(22) PCT Filed: Dec. 14, 2017

(86) PCT No.: PCT/CN2017/116283
§ 371 (c)(1),
(2) Date: Jan. 11, 2018

(87) PCT Pub. No.: WO2019/095482
PCT Pub. Date: May 23, 2019

(65) Prior Publication Data
US 2020/0083254 A1    Mar. 12, 2020

(30) Foreign Application Priority Data
Nov. 16, 2017  (CN) .......................... 2017 1 1140087

(51) Int. Cl.
*H01L 27/12*     (2006.01)
*H01L 27/32*     (2006.01)
*G02F 1/1343*    (2006.01)

(52) U.S. Cl.
CPC ........ *H01L 27/124* (2013.01); *H01L 27/1248* (2013.01); *H01L 27/1288* (2013.01); *H01L 27/3248* (2013.01); *G02F 1/13439* (2013.01)

(58) Field of Classification Search
CPC .............. H01L 27/124; H01L 27/1288; H01L 27/1248; H01L 27/3248; H01L 27/1214; G02F 1/13439
See application file for complete search history.

(56) References Cited

U.S. PATENT DOCUMENTS

2003/0142253 A1*  7/2003  Takenaka .......... G02F 1/133555
                                              349/113
2005/0186359 A1*  8/2005  Ishizuka ................... C23F 1/26
                                              428/1.1
(Continued)

FOREIGN PATENT DOCUMENTS

CN    1987622 A    6/2007
CN    1991470 A    7/2007
(Continued)

*Primary Examiner* — Kenneth Parker
*Assistant Examiner* — Scott E Bauman
(74) *Attorney, Agent, or Firm* — Hemisphere Law, PLLC; Zhigang Ma

(57) ABSTRACT

A TFT substrate and a manufacturing method thereof provided, including: depositing a metal thin film and a transparent conductive thin film on TFTs sequentially; coating a photoresist on the transparent conductive thin film, exposing and developing the photoresist via a half-tone mask to obtain a first photoresist layer and a second photoresist layer; etching the transparent conductive thin film and the metal thin film not covered by the first photoresist layer and the second photoresist layer; ashing the first photoresist layer and the second photoresist layer to remove the second photoresist layer; etching the transparent conductive thin film to expose the metal thin film not covered by the first photoresist layer; oxidizing the metal thin film to form a (Continued)

metal oxide thin film as a passivation layer; and stripping off the first photoresist layer to expose the metal thin film and the transparent conductive thin film as the pixel electrode.

7 Claims, 4 Drawing Sheets

(56) References Cited

U.S. PATENT DOCUMENTS

| | | | | |
|---|---|---|---|---|
| 2007/0166859 A1* | 7/2007 | Lee | ................... | G02F 1/136213 |
| | | | | 438/30 |
| 2008/0176346 A1 | 7/2008 | Shih et al. | | |
| 2009/0321740 A1* | 12/2009 | Xiao | ..................... | G02F 1/1362 |
| | | | | 257/59 |
| 2011/0068341 A1* | 3/2011 | Li | ....................... | G02F 1/13439 |
| | | | | 257/59 |

FOREIGN PATENT DOCUMENTS

| | | |
|---|---|---|
| CN | 101614917 A | 12/2009 |
| CN | 102116984 A | 7/2011 |
| CN | 105632896 A | 6/2016 |
| CN | 106847757 A | 6/2017 |

* cited by examiner

TFT SUBSTRATE AND MANUFACTURING METHOD THEREOF

RELATED APPLICATIONS

The present application is a National Phase of International Application Number PCT/CN2017/116283, filed on Dec. 14, 2017, and claims the priority of China Application 201711140087.2, filed on Nov. 16, 2017.

FIELD OF THE DISCLOSURE

The disclosure relates to a display technical field, and more particularly to a TFT substrate and a manufacturing method thereof.

BACKGROUND

A flat display device has various advantages, such as thin device body, low power consumption, and being free of radiation, and is thus of wide applications. The flat display devices that are currently available include liquid crystal displays (LCDs) and organic electroluminescence devices (OELDs), which are also referred to as organic light emitting diodes (OLEDs).

Most of the liquid crystal displays on the market are backlight type liquid crystal displays, which include a housing, a liquid crystal panel disposed in the housing, and a backlight module disposed in the housing. The liquid crystal display panel includes a color filter (CF) substrate, a thin film transistor (TFT) array substrate, and a liquid crystal layer between the CF substrate and the TFT substrate. The principle of operation of the liquid crystal display panel is that liquid crystal molecules are interposed between two parallel glass substrates and a driving voltage is applied to the glass substrates to control the rotation of the liquid crystal molecules so as to refract out the light from the backlight module to form an image.

The organic electroluminescent display also needs a TFT substrate, a TFT as a switching part and a driving part, and a pixel structure is arranged in matrix on the TFT substrate.

Currently, the technology of using an oxide semiconductor such as indium gallium zinc oxide (IGZO) as a channel layer of a TFT is a hot technology. Oxide semiconductors have higher carrier mobility, which can greatly improve the charge-discharge rate of the TFT to the pixel electrode and achieve a faster refresh rate. Moreover, oxide semiconductors have high compatibility with amorphous silicon processes, so oxide semiconductors are becoming the material of choice for the channel layer of TFTs in LCDs and OLEDs.

In the TFT substrate, the material of each insulating layer (such as a gate insulating layer, a passivation layer and so on) is generally a laminated structure of silicon oxide (SiOx) and silicon nitride (SiNx). The gas of etching SiOx generally uses tetrafluoromethane (CF4), the gas is easy to form a compound on the surface of metal (such as copper (Cu)), so the electrical contact characteristics of the metal surface is affected. In order to solve this problem, when manufacturing a TFT substrate, the via holes required for the gate of the TFT are usually etched separately from the via holes required for the TFT source/drain. That is, the via holes of the gate insulating layer and the passivation layer are separately formed. Then, a pixel electrode is formed on the passivation layer, a mask is used to form the via holes in the gate insulating layer, another mask is used to form the via holes in a passivation layer, and another mask is used to pattern the pixel electrode. Therefore, the number of masks required for the entire TFT substrate process is relatively large, and the manufacturing cost is high.

SUMMARY

A technical problem to be solved by the disclosure is to provide a manufacturing method of a TFT substrate, so the number of masks required for the process could be reduced, the manufacturing cost could be decreased, and the production capacity could be improved.

Another technical problem to be solved by the disclosure is to provide a TFT substrate, so the manufacturing cost could be decreased, and the production capacity could be improved.

To achieve the above object, according to one aspect, the embodiment of the disclosure provides a manufacturing method of a TFT substrate, including the following steps:

step S1: providing a base substrate, and manufacturing a plurality of TFTs arranged in matrix on the base substrate;

step S2: depositing a metal thin film and a transparent conductive thin film on the TFTs sequentially;

step S3: coating a photoresist on the transparent conductive thin film, exposing and developing the photoresist via a half-tone mask to pattern the photoresist, and obtaining a first photoresist layer and a second photoresist layer, a thickness of the first photoresist layer is greater than a thickness of the second photoresist layer;

wherein a pattern of the first photoresist layer is same with a pattern of a pixel electrode to be formed, the TFTs includes a plurality of sources, a plurality of drains and a plurality of channel layers, a portion of the drains away from the sources are covered by the first photoresist layer, another portion of the drains, the sources and the channel layers are covered by the second photoresist layer;

step S4: etching the transparent conductive thin film and the metal thin film not covered by the first photoresist layer and the second photoresist layer;

step S5: ashing the first photoresist layer and the second photoresist layer to remove the second photoresist layer and reduce the thickness of the first photoresist layer;

step S6: etching the transparent conductive thin film exposed by the second photoresist layer to expose the metal thin film not covered by the first photoresist layer;

step S7: oxidizing the metal thin film exposed by the first photoresist layer to form a metal oxide thin film as a passivation layer; and step S8: stripping off the first photoresist layer to expose the metal thin film and the transparent conductive thin film as the pixel electrode;

wherein the pixel electrode is in contact with the portion of the drains away from the sources.

In an embodiment, a material of the metal thin film includes aluminum, molybdenum or titanium, and the metal oxide thin film includes aluminum oxide, molybdenum oxide or titanium oxide.

In an embodiment, a material of the transparent conductive thin film includes indium tin oxide.

In an embodiment, a thickness of the metal thin film is less than 50 nm.

In an embodiment, the TFTs includes oxide semiconductor TFT.

In an embodiment, oxidizing the metal thin film exposed by the first photoresist layer in step S7 includes using oxygen plasma.

According to another aspect, the embodiment of the disclosure provides a TFT substrate, including:
- a base substrate;
- a plurality of TFTs, arranged in matrix on the base substrate; and
- a passivation layer and a pixel electrode, disposed on the TFTs;
- wherein the TFTs include a plurality of sources, a plurality of drains and a plurality of channel layers, the pixel electrode includes a metal thin film and a transparent conductive thin film disposed on the metal thin film, and the metal thin film of the pixel electrode is in contact with the portion of the drains away from the sources;
- wherein the passivation layer covers another portion of the drains, the sources and the channel layers, and the passivation layer is a metal oxide thin film formed by the metal thin film of the pixel electrode.

In an embodiment, a material of the metal thin film of the pixel electrode includes aluminum, molybdenum or titanium, the passivation layer includes aluminum oxide, molybdenum oxide or titanium oxide, and a material of the transparent conductive thin film of the pixel electrode includes indium tin oxide.

In an embodiment, a thickness of the metal thin film of the pixel electrode is less than 50 nm.

In an embodiment, the TFTs includes oxide semiconductor TFT.

According to another aspect, the embodiment of the disclosure provides a manufacturing method of a TFT substrate, including the following steps:

step S1: providing a base substrate, and manufacturing a plurality of TFTs arranged in matrix on the base substrate;

step S2: depositing a metal thin film and a transparent conductive thin film on the TFTs sequentially;

step S3: coating a photoresist on the transparent conductive thin film, exposing and developing the photoresist via a half-tone mask to pattern the photoresist, and obtaining a first photoresist layer and a second photoresist layer, a thickness of the first photoresist layer is greater than a thickness of the second photoresist layer;

wherein a pattern of the first photoresist layer is same with a pattern of a pixel electrode to be formed, the TFTs includes a plurality of sources, a plurality of drains and a plurality of channel layers, a portion of the drains away from the sources are covered by the first photoresist layer, another portion of the drains, the sources and the channel layers are covered by the second photoresist layer;

step S4: etching the transparent conductive thin film and the metal thin film not covered by the first photoresist layer and the second photoresist layer;

step S5: ashing the first photoresist layer and the second photoresist layer to remove the second photoresist layer and reduce the thickness of the first photoresist layer;

step S6: etching the transparent conductive thin film exposed by the second photoresist layer to expose the metal thin film not covered by the first photoresist layer;

step S7: oxidizing the metal thin film exposed by the first photoresist layer to form a metal oxide thin film as a passivation layer; and step S8: stripping off the first photoresist layer to expose the metal thin film and the transparent conductive thin film as the pixel electrode;

wherein the pixel electrode is in contact with the portion of the drains away from the sources;

wherein a material of the metal thin film includes aluminum, molybdenum or titanium, and the metal oxide thin film includes aluminum oxide, molybdenum oxide or titanium oxide;

wherein a material of the transparent conductive thin film includes indium tin oxide;

wherein a thickness of the metal thin film is less than 50 nm;

wherein the TFTs includes oxide semiconductor TFT, wherein oxidizing the metal thin film exposed by the first photoresist layer in step S7 includes using oxygen plasma.

By practice of the disclosure, the manufacturing method of a TFT substrate provided by the embodiments of the disclosure could manufacture the passivation layer and the pixel electrode via a half-tone mask, compare to the conventional technology could reduce the number of masks required for the process, so the manufacturing cost could be decreased, and the production capacity could be improved. The TFT substrate includes a pixel electrode includes a metal thin film and a transparent conductive thin film disposed on the metal thin film, and a passivation layer is a metal oxide thin film formed by the metal thin film of the pixel electrode. The TFT substrate is manufactured via the above-mentioned manufacturing method of a TFT substrate, so the manufacturing cost could be decreased, and the production capacity could be improved.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The disclosure will be further described in detail with reference to accompanying drawings and preferred embodiments as follows.

Figure 1:
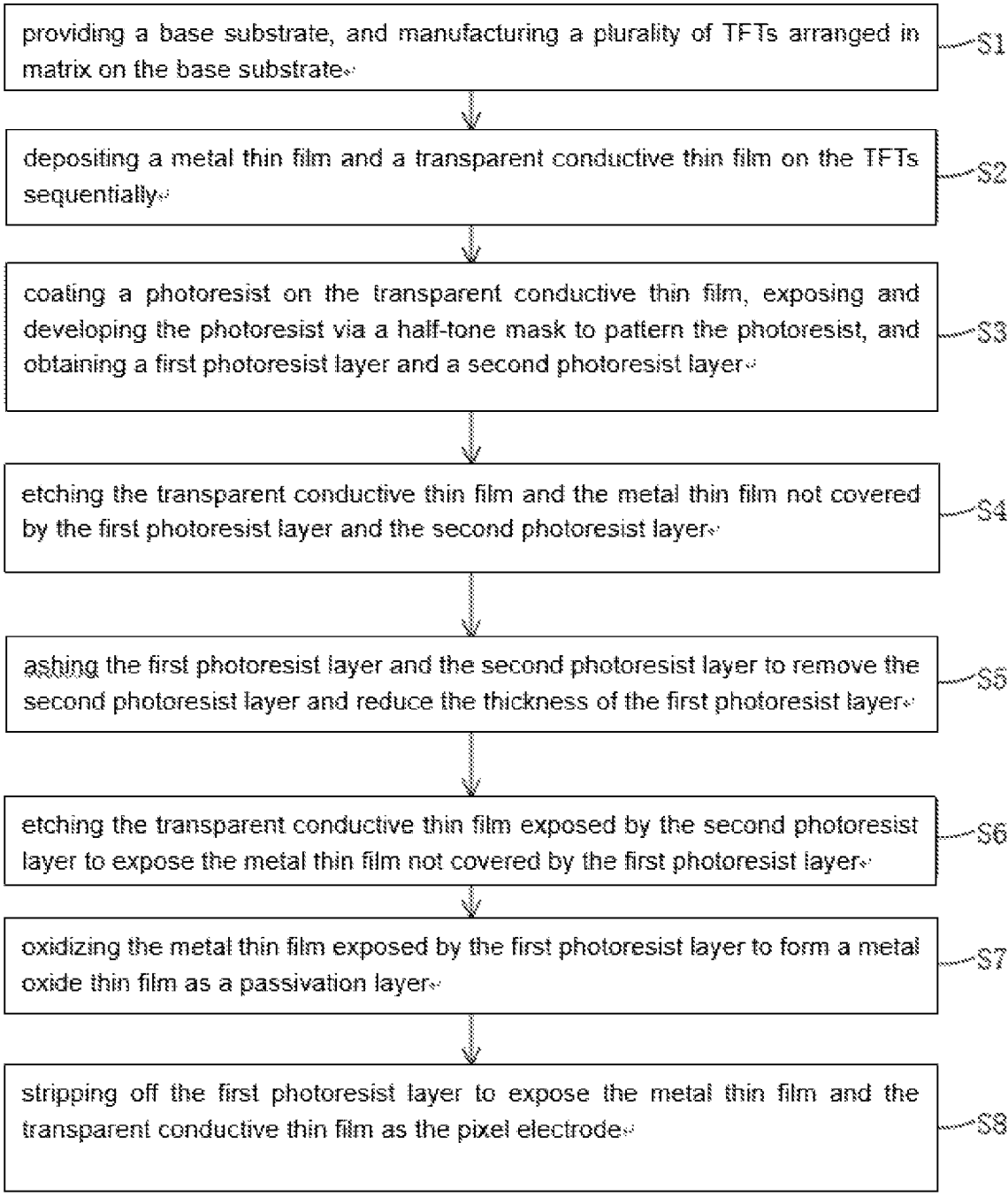
FIG. 1 is a flow chart diagram of a manufacturing method of a TFT substrate according to an embodiment of the disclosure.
Figure 2:
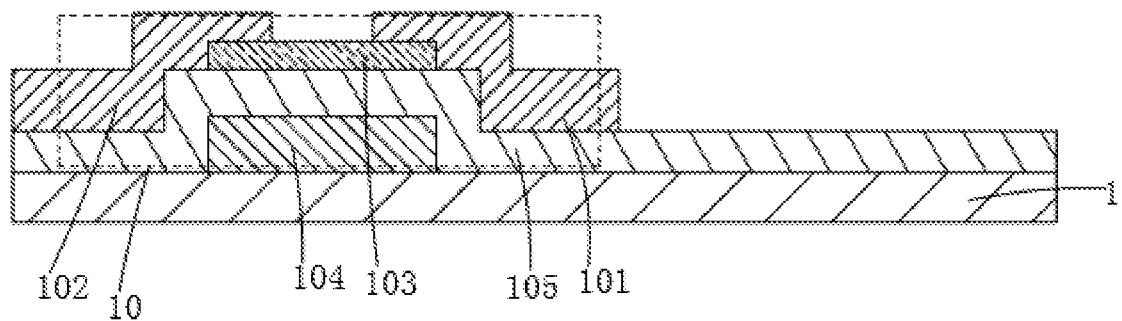
FIG. 2 is a schematic diagram of step S1 of a manufacturing method of a TFT substrate according to an embodiment of the disclosure.

As shown in FIG. 1, a manufacturing method of a TFT substrate provided by the disclosure, including the following steps:

Step S1: as shown in FIG. 2, providing a base substrate 1, and manufacturing a plurality of TFTs 10 arranged in matrix on the base substrate 1.

Specifically, the base substrate 1 includes a glass substrate.

The structure type of the TFT 10 is not limited, may includes back-channel-etching (BCE) type TFT, or etching-stop-layer type TFT. Take BCE type TFT for example, as shown in FIG. 2, the TFT 10 includes a gate 104 disposed on the base substrate 1, a gate insulating layer 105 covering the gate 104 and the base substrate 1, a channel layer 103 disposed on the gate insulating layer 105 and located on the gate 104, and a source 102 and a drain 103 disposed on the gate insulating layer 105 and in contact with two sides of the channel layer 103. This is no different from the prior art, the TFT 10 can be manufactured by the existing conventional process, which is not described herein.

Furthermore, the TFT 10 may include oxide semiconductor TFT. That is, a material of the channel layer 103 of the TFT 10 includes indium gallium zinc oxide (IGZO) or other suitable oxide material.

Figure 3:
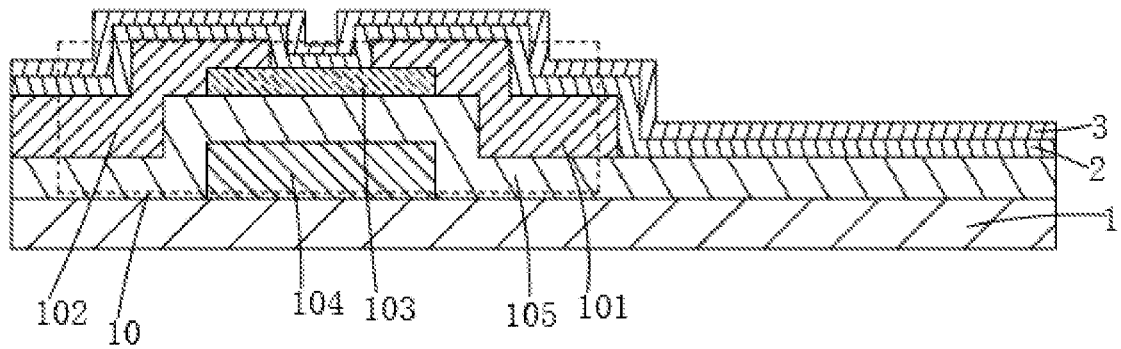
FIG. 3 is a schematic diagram of step S2 of a manufacturing method of a TFT substrate according to an embodiment of the disclosure.

Step S2: as shown in FIG. 3, depositing a metal thin film 2 and a transparent conductive thin film 3 on the TFTs 10 sequentially.

Specifically, a material of the metal thin film 2 includes aluminum, molybdenum or titanium. In order to contribute to the transparency of the pixel electrode, a thickness of the metal thin film 2 is preferably less than 50 nm.

Wherein a material of the transparent conductive thin film 3 includes indium tin oxide (ITO).

Figure 4:
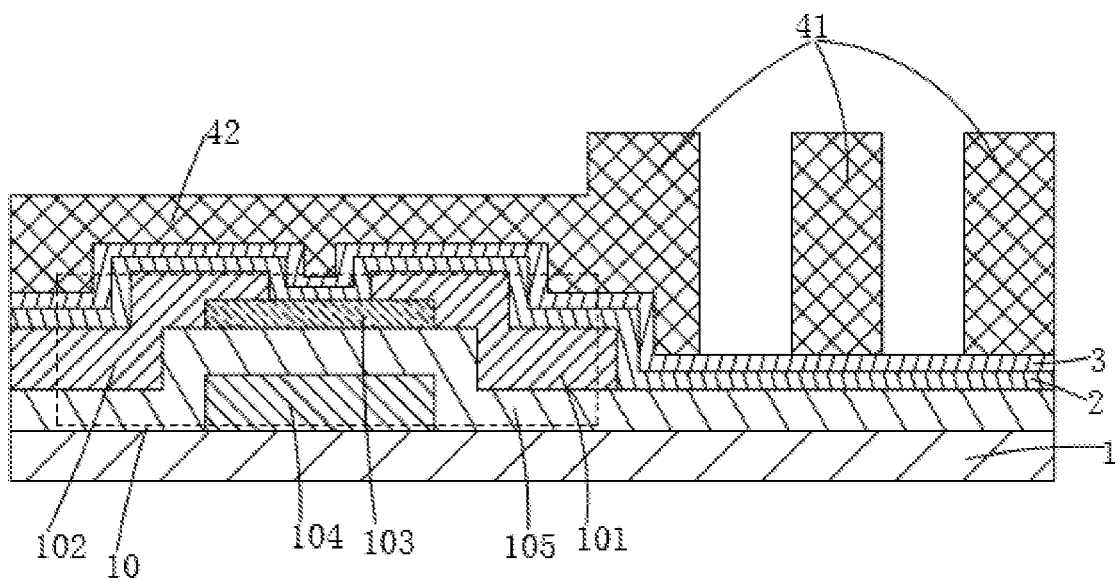
FIG. 4 is a schematic diagram of step S3 of a manufacturing method of a TFT substrate according to an embodiment of the disclosure.

Step S3: as shown in FIG. 4, coating a photoresist on the transparent conductive thin film 3, exposing and developing the photoresist via a half-tone mask to pattern the photoresist, and obtaining a first photoresist layer 41 and a second photoresist layer 42, a thickness of the first photoresist layer 41 is greater than a thickness of the second photoresist layer 42.

Wherein a pattern of the first photoresist layer 41 is same with a pattern of a pixel electrode to be formed, the TFT 10 includes a drain 101, a source 102 and a channel layer 103, a portion of the drain 101 away from the source 102 are covered by the first photoresist layer 41, another portion of the drain 101, the source 102 and the channel layer 103 are covered by the second photoresist layer 42.

Figure 5:
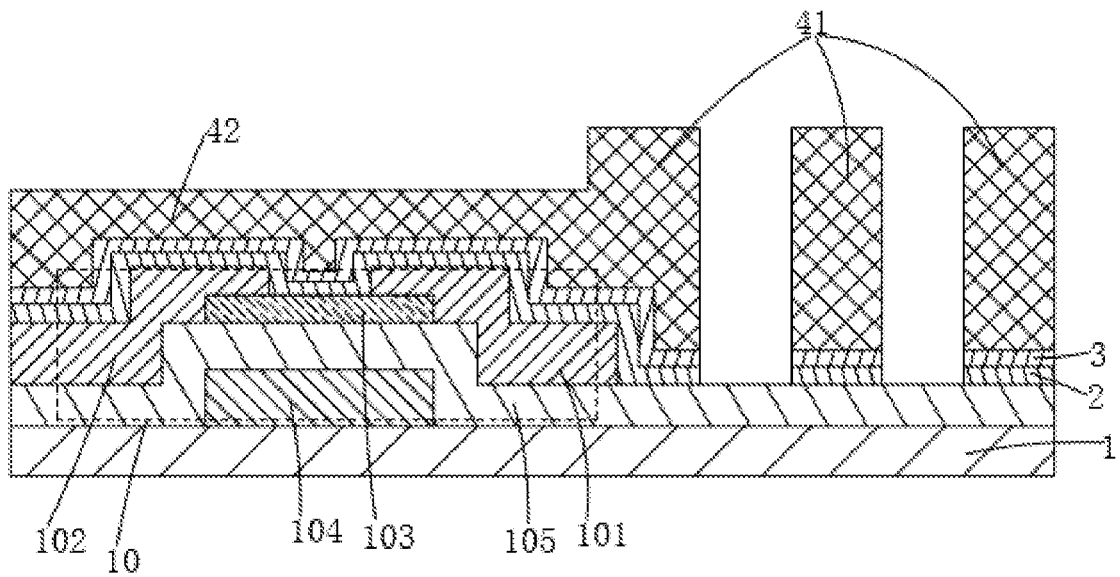
FIG. 5 is a schematic diagram of step S4 of a manufacturing method of a TFT substrate according to an embodiment of the disclosure.

Step S4: as shown in FIG. 5, etching the transparent conductive thin film 3 and the metal thin film 2 not covered by the first photoresist layer 41 and the second photoresist layer 42.

Figure 6:
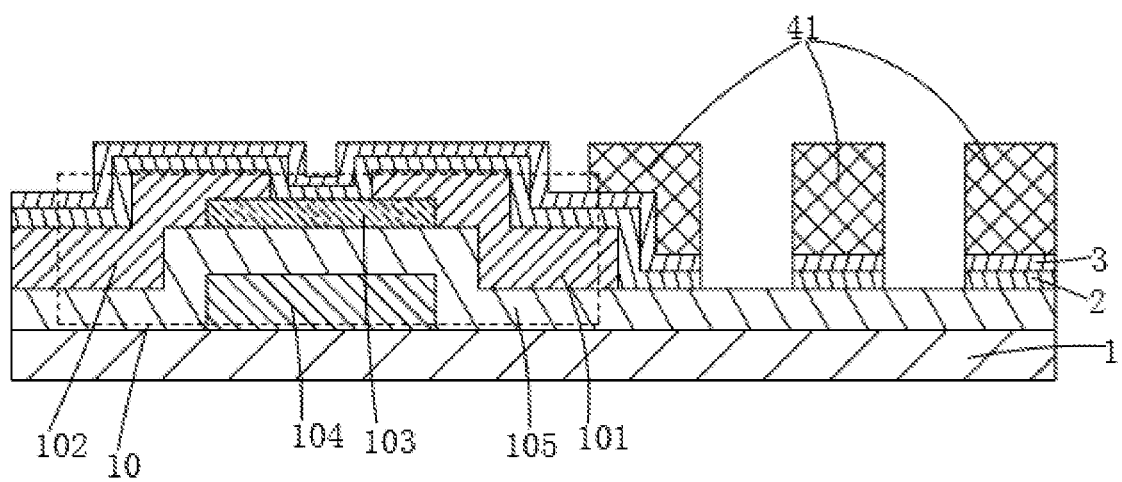
FIG. 6 is a schematic diagram of step S5 of a manufacturing method of a TFT substrate according to an embodiment of the disclosure.

Step S5: as shown in FIG. 6, ashing the first photoresist layer 41 and the second photoresist layer 42 to remove the second photoresist layer 42 and reduce the thickness of the first photoresist layer 41.

Figure 7:
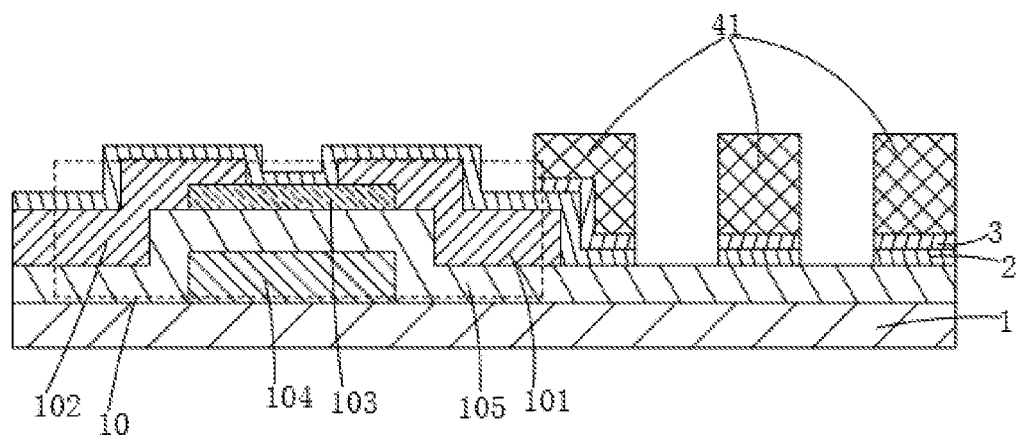
FIG. 7 is a schematic diagram of step S6 of a manufacturing method of a TFT substrate according to an embodiment of the disclosure.

Step S6: as shown in FIG. 7, etching the transparent conductive thin film 3 exposed by the second photoresist layer 42 to expose the metal thin film 2 not covered by the first photoresist layer 41.

Figure 8:
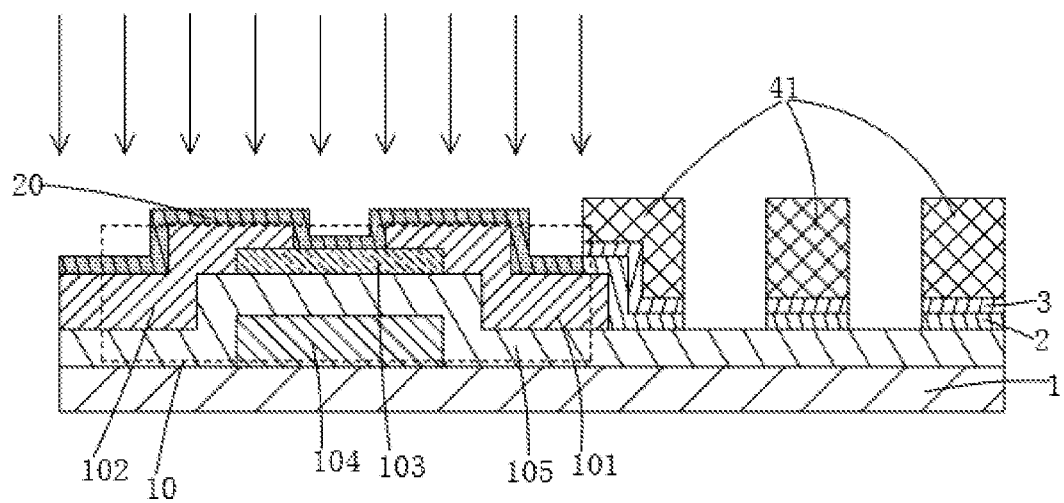
FIG. 8 is a schematic diagram of step S7 of a manufacturing method of a TFT substrate according to an embodiment of the disclosure.

Step S7: as shown in FIG. 8, oxidizing the metal thin film 2 exposed by the first photoresist layer to form a metal oxide thin film as a passivation layer 20, and the metal oxide thin film includes aluminum oxide (AlOx), molybdenum oxide (MoOx) or titanium oxide (TiOx).

Figure 9:
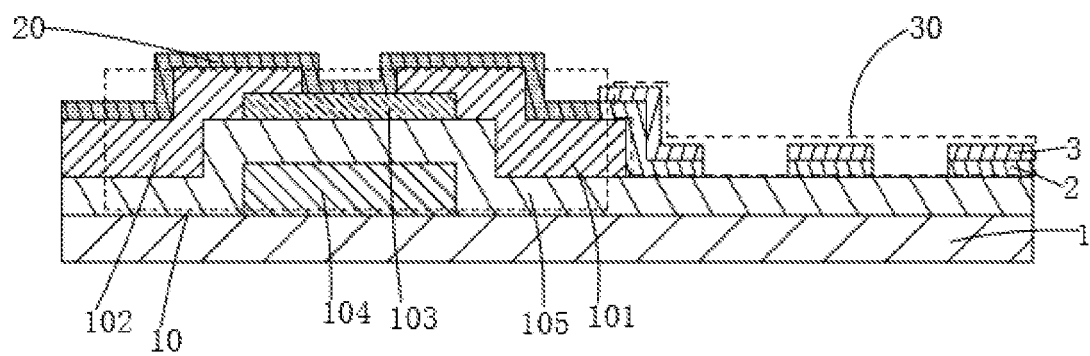
FIG. 9 is a schematic diagram of step S8 of a manufacturing method of a TFT substrate and a schematic structural diagram of a TFT substrate according to an embodiment of the disclosure.

Step S8: as shown in FIG. 9, stripping off the first photoresist layer 41 to expose the metal thin film 2 and the transparent conductive thin film 3 as the pixel electrode 30.

Wherein the pixel electrode 30 is in contact with the portion of the drain 101 away from the source 102.

The above-mentioned manufacturing method of a TFT substrate could manufacture the passivation layer 20 and the pixel electrode 30 via a half-tone mask, and the passivation layer 20 is the metal oxide thin film formed by the metal thin film 2 of the pixel electrode 30, so it is no need to form the via hole in the passivation layer 20, the pixel electrode 30 could be directly in contact with the portion of the drain 101 away from the source 102, compare to the conventional technology could reduce the number of masks required for the process, so the manufacturing cost could be decreased, and the production capacity could be improved.

As shown in FIG. 9, a TFT substrate is further provided by the disclosure, including: a base substrate 1, a plurality of TFTs 10 arranged in matrix on the base substrate 1, and a passivation layer 20 and a pixel electrode 30 disposed on the TFTs 10.

Wherein the TFT 10 includes a drain 101, a source 102 and a channel layer 103, the pixel electrode 30 includes a metal thin film 2 and a transparent conductive thin film 3 disposed on the metal thin film 2, and the metal thin film 2 of the pixel electrode 30 is in contact with the portion of the drain 101 away from the source 102.

Wherein the passivation layer 20 covers another portion of the drain 101, the source 102 and the channel layer 103, and the passivation layer 20 is a metal oxide thin film formed by the metal thin film 2 of the pixel electrode 30.

Specifically, the base substrate 1 includes a glass substrate.

The structure type of the TFT 10 is not limited, may includes back-channel-etching (BCE) type TFT, or etching-stop-layer type TFT. Take BCE type TFT for example, as shown in FIG. 9, the TFT 10 includes a gate 104 disposed on the base substrate 1, a gate insulating layer 105 covering the gate 104 and the base substrate 1, a channel layer 103 disposed on the gate insulating layer 105 and located on the gate 104, and a source 102 and a drain 103 disposed on the gate insulating layer 105 and in contact with two sides of the channel layer 103. This is no different from the prior art. Furthermore, the TFT 10 may include oxide semiconductor TFT. That is, a material of the channel layer 103 of the TFT 10 includes indium gallium zinc oxide (IGZO) or other suitable oxide material.

Specifically, a material of the metal thin film 2 includes aluminum, molybdenum or titanium. In order to contribute to the transparency of the pixel electrode, a thickness of the metal thin film 2 is preferably less than 50 nm.

Wherein a material of the transparent conductive thin film 3 includes indium tin oxide (ITO).

Wherein a metal oxide thin film as a passivation layer 20, and the metal oxide thin film includes aluminum oxide (AlOx), molybdenum oxide (MoOx) or titanium oxide (TiOx).

The TFT substrate provided by the disclosure includes the pixel electrode 30, the pixel electrode 30 includes the metal thin film 2 and the transparent conductive thin film 3 disposed on the metal thin film 2, and the passivation layer 20 is a metal oxide thin film formed by the metal thin film 2 of the pixel electrode 30. The TFT substrate is manufactured via the above-mentioned manufacturing method of a TFT substrate, so the manufacturing cost could be decreased, and the production capacity could be improved.

In summary, the manufacturing method of a TFT substrate provided by the embodiments of the disclosure could manufacture the passivation layer and the pixel electrode via a half-tone mask, compare to the conventional technology could reduce the number of masks required for the process, so the manufacturing cost could be decreased, and the production capacity could be improved. The TFT substrate includes a pixel electrode includes a metal thin film and a transparent conductive thin film disposed on the metal thin film, and a passivation layer is a metal oxide thin film formed by the metal thin film of the pixel electrode. The TFT substrate is manufactured via the above-mentioned manufacturing method of a TFT substrate, so the manufacturing cost could be decreased, and the production capacity could be improved.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A manufacturing method of a TFT substrate, comprising the following steps:
    step S1: providing a base substrate, and manufacturing a plurality of TFTs arranged in matrix on the base substrate;
    step S2: depositing a metal thin film and a transparent conductive thin film on the TFTs sequentially;
    step S3: coating a photoresist on the transparent conductive thin film, exposing and developing the photoresist via a half-tone mask to pattern the photoresist, and obtaining a first photoresist layer and a second photoresist layer, a thickness of the first photoresist layer is greater than a thickness of the second photoresist layer;
    wherein a pattern of the first photoresist layer is same with a pattern of a pixel electrode to be formed, the TFTs includes a plurality of sources, a plurality of drains and a plurality of channel layers, a portion of the drains away from the sources are covered by the first photoresist layer, another portion of the drains, the sources and the channel layers are covered by the second photoresist layer;
    step S4: etching the transparent conductive thin film and the metal thin film not covered by the first photoresist layer and the second photoresist layer;
    step S5: ashing the first photoresist layer and the second photoresist layer to remove the second photoresist layer and reduce the thickness of the first photoresist layer;
    step S6: etching the transparent conductive thin film exposed by the second photoresist layer to expose the metal thin film not covered by the first photoresist layer;
    step S7: oxidizing the metal thin film exposed by the first photoresist layer to form a metal oxide thin film as a passivation layer; and
    step S8: stripping off the first photoresist layer to expose the metal thin film and the transparent conductive thin film as the pixel electrode;
    wherein the pixel electrode is in contact with the portion of the drains away from the sources.

2. The manufacturing method of a TFT substrate according to claim 1, wherein a material of the metal thin film includes aluminum, molybdenum or titanium, and the metal oxide thin film includes aluminum oxide, molybdenum oxide or titanium oxide.

3. The manufacturing method of a TFT substrate according to claim 1, wherein a material of the transparent conductive thin film includes indium tin oxide.

4. The manufacturing method of a TFT substrate according to claim 1, wherein a thickness of the metal thin film is less than 50 nm.

5. The manufacturing method of a TFT substrate according to claim 1, wherein the TFTs includes oxide semiconductor TFT.

6. The manufacturing method of a TFT substrate according to claim 1, wherein oxidizing the metal thin film exposed by the first photoresist layer in step S7 includes using oxygen plasma.

7. A manufacturing method of a TFT substrate, comprising the following steps:
    step S1: providing a base substrate, and manufacturing a plurality of TFTs arranged in matrix on the base substrate;
    step S2: depositing a metal thin film and a transparent conductive thin film on the TFTs sequentially;
    step S3: coating a photoresist on the transparent conductive thin film, exposing and developing the photoresist via a half-tone mask to pattern the photoresist, and obtaining a first photoresist layer and a second photoresist layer, a thickness of the first photoresist layer is greater than a thickness of the second photoresist layer;
    wherein a pattern of the first photoresist layer is same with a pattern of a pixel electrode to be formed, the TFTs includes a plurality of sources, a plurality of drains and a plurality of channel layers, a portion of the drains away from the sources are covered by the first photoresist layer, another portion of the drains, the sources and the channel layers are covered by the second photoresist layer;
    step S4: etching the transparent conductive thin film and the metal thin film not covered by the first photoresist layer and the second photoresist layer;
    step S5: ashing the first photoresist layer and the second photoresist layer to remove the second photoresist layer and reduce the thickness of the first photoresist layer;
    step S6: etching the transparent conductive thin film exposed by the second photoresist layer to expose the metal thin film not covered by the first photoresist layer;
    step S7: oxidizing the metal thin film exposed by the first photoresist layer to form a metal oxide thin film as a passivation layer; and
    step S8: stripping off the first photoresist layer to expose the metal thin film and the transparent conductive thin film as the pixel electrode;
    wherein the pixel electrode is in contact with the portion of the drains away from the sources;
    wherein a material of the metal thin film includes aluminum, molybdenum or titanium, and the metal oxide thin film includes aluminum oxide, molybdenum oxide or titanium oxide;

wherein a material of the transparent conductive thin film includes indium tin oxide;

wherein a thickness of the metal thin film is less than 50 nm;

wherein the TFTs includes oxide semiconductor TFT;

wherein oxidizing the metal thin film exposed by the first photoresist layer in step S7 includes using oxygen plasma.

* * * * *